United States Patent
Buis et al.

(10) Patent No.: US 9,494,878 B2
(45) Date of Patent: Nov. 15, 2016

(54) ACTUATION MECHANISM, OPTICAL APPARATUS, LITHOGRAPHY APPARATUS AND METHOD OF MANUFACTURING DEVICES

(71) Applicant: ASML Netherlands B.V., Veldhoven (NL)

(72) Inventors: Edwin Johan Buis, Belfeld (NL); Gosse Charles De Vries, Veldhoven (NL); Sven Antoin Johan Hol, Eindhoven (NL); Erik Maria Rekkers, Boxtel (NL)

(73) Assignee: ASML Netherlands B.V., Veldhoven (NL)

(*) Notice: Subject to any disclaimer, the term of this patent is extended or adjusted under 35 U.S.C. 154(b) by 0 days.

(21) Appl. No.: 14/435,315

(22) PCT Filed: Sep. 17, 2013

(86) PCT No.: PCT/EP2013/069299
§ 371 (c)(1),
(2) Date: Apr. 13, 2015

(87) PCT Pub. No.: WO2014/060169
PCT Pub. Date: Apr. 24, 2014

(65) Prior Publication Data
US 2015/0261093 A1    Sep. 17, 2015

Related U.S. Application Data

(60) Provisional application No. 61/713,930, filed on Oct. 15, 2012.

(51) Int. Cl.
*G03F 7/20* (2006.01)
*H02K 41/035* (2006.01)
(Continued)

(52) U.S. Cl.
CPC ......... *G03F 7/70833* (2013.01); *G02B 7/1828* (2013.01); *G02B 26/0816* (2013.01);
(Continued)

(58) Field of Classification Search
CPC ............. G02B 7/1828; G03F 7/70825; G03F 7/70833; H02K 16/00; H02K 41/0352; H02K 41/0356; H02K 49/10; H02K 11/0089; H02K 11/40
See application file for complete search history.

(56) References Cited

U.S. PATENT DOCUMENTS

| 5,270,737 A | 12/1993 | Nakasugi et al. |
| 6,059,250 A | 5/2000 | Reuter et al. |

(Continued)

FOREIGN PATENT DOCUMENTS

| CN | 101373338 A | 2/2009 |
| DE | 102011076658 A1 | 5/2012 |

(Continued)

OTHER PUBLICATIONS

Ishikawa, I., et al, "Integrated micro-displacement sensor that measures tilting angle and linear movement of an external mirror," Sensors and Actuators A: Physical, vol. 138, Issue 2, Aug. 26, 2007; pp. 269-275.

(Continued)

*Primary Examiner* — Michelle M Iacoletti
(74) *Attorney, Agent, or Firm* — Sterne, Kessler, Goldstein & Fox P.L.L.C.

(57) ABSTRACT

An EUV optical apparatus includes a number of adjustable mirrors (22x) on mirror bodies (120). Each mirror body is supported on an actuator (100x) comprising a moving part (132, 134, 136) and a fixed casing part (128, 130). The actuator provides a resilient support (140, 142) for the mirror body so that it is tiltable with two degrees relative to the casing. An electromagnetic motor (166, 170-178) applies first part, under the influence of an applied motive force, the resilient mounting being arranged to provide a biasing force that resists said motive force. A magnetic coupling (102, 104a, 104b) is arranged between the moving and fixed parts so as to provide a counter-biasing force. The counter-biasing force partly opposes said biasing force and thereby reduces the motive force required to effect a given displacement. The actuator can thus be made with reduced size, weight and heat dissipation.

15 Claims, 7 Drawing Sheets

(51) Int. Cl.
  *H02K 16/00* (2006.01)
  *G02B 7/182* (2006.01)
  *G02B 26/08* (2006.01)
  *H01F 7/02* (2006.01)
  *H02K 49/10* (2006.01)
  *G02B 5/08* (2006.01)
  *G02B 19/00* (2006.01)

(52) U.S. Cl.
  CPC ......... *G03F 7/7015* (2013.01); *G03F 7/70825* (2013.01); *H01F 7/0205* (2013.01); *H02K 11/40* (2016.01); *H02K 16/00* (2013.01); *H02K 41/0352* (2013.01); *H02K 41/0356* (2013.01); *H02K 49/10* (2013.01); *G02B 5/0891* (2013.01); *G02B 19/0023* (2013.01); *G03F 7/70116* (2013.01)

(56) References Cited

U.S. PATENT DOCUMENTS

| | | | |
|---|---|---|---|
| 6,208,045 | B1 | 3/2001 | Hazelton et al. |
| 7,999,920 | B2 | 8/2011 | Ye et al. |
| 2005/0030653 | A1 | 2/2005 | Holderer et al. |
| 2012/0044474 | A1 | 2/2012 | Hauf et al. |

FOREIGN PATENT DOCUMENTS

| | | |
|---|---|---|
| JP | 2002-323584 A | 11/2002 |
| WO | WO 2008/131930 A1 | 11/2008 |
| WO | WO 2011/000671 A1 | 1/2011 |
| WO | WO 2011/023419 A1 | 3/2011 |
| WO | WO 2011/023423 A1 | 3/2011 |

OTHER PUBLICATIONS

International Search Report directed to related International Patent Application No. PCT/EP2013/069299, mailed Jan. 2, 2014; 3 pages.
International Preliminary Report on Patentability and Written Opinion of the International Searching Authority directed to related International Patent Application No. PCT/EP2013/069299, issued Apr. 21, 2015; 6 pages.
International Search Report directed to related International Patent Application No. PCT/EP2013/069301, mailed Apr. 2, 2014; 7 pages.
International Preliminary Report on Patentability and Written Opinion of the International Searching Authority directed to related International Patent Application No. PCT/EP2013/069301, issued Apr. 21, 2015; 8 pages.
U.S. Appl. No. 14/435,450, Van Schoot et al., "Actuation Mechanism, Optical Apparatus, Lithography Apparatus and Method of Manufacturing Devices," filed Apr. 13, 2015.

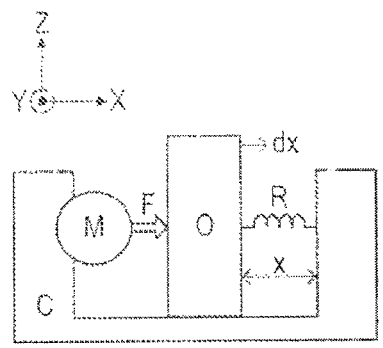
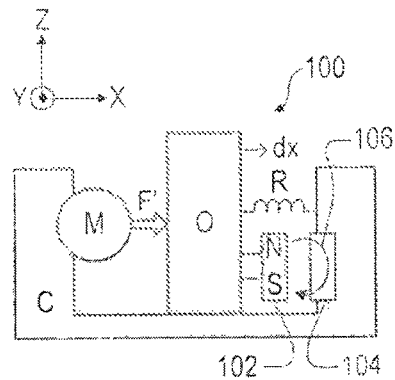
Fig. 5(a)　　　　Fig. 5(b)
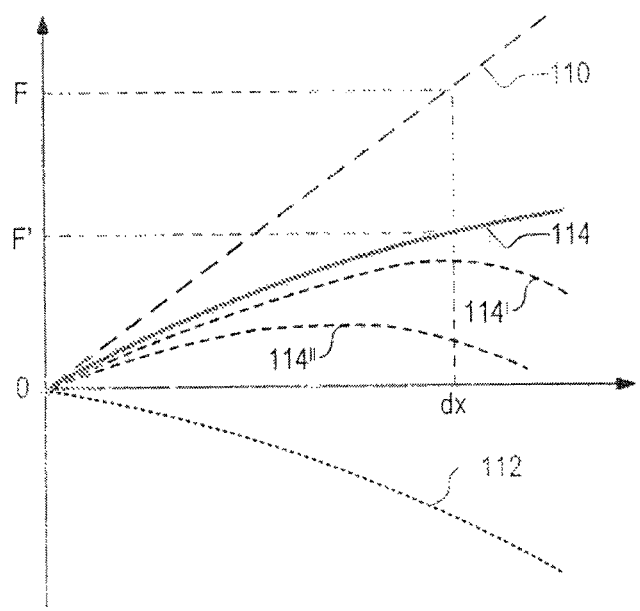
Fig. 6

ACTUATION MECHANISM, OPTICAL APPARATUS, LITHOGRAPHY APPARATUS AND METHOD OF MANUFACTURING DEVICES

CROSS-REFERENCE TO RELATED APPLICATIONS

This application claims the benefit of U.S. provisional application 61/713,930, which was filed on 15 Oct. 2012, and which is incorporated herein in its entirety by reference.

FIELD

The invention relates to actuation mechanisms that may be applied in a range of apparatuses and instruments. An example application is in a conditioning of a radiation beam, for example in the field of lithography.

BACKGROUND

Lithography is widely recognized as one of the key steps in the manufacture of integrated circuits (ICs) and other devices and/or structures. However, as the dimensions of features made using lithography become smaller, lithography is becoming a more critical factor for enabling miniature IC or other devices and/or structures to be manufactured.

A lithographic apparatus is a machine that applies a desired pattern onto a substrate, usually onto a target portion of the substrate. A lithographic apparatus can be used, for example, in the manufacture of ICs. In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

In lithographic apparatuses typically many moving parts are provided with various degrees of freedom, and the positions (including linear and angular position (orientation), velocities and accelerations) are controlled automatically via numerous actuation mechanisms (actuators). Actuators may be electromagnetically operated, pneumatically of hydraulically operated. They are often constrained to effect movement in only one degree of freedom (linear or rotational). Where the moving parts are to be controlled in plural degrees of freedom, more complex mechanisms may be provided, or multiple single-degree mechanisms may be combined.

In order to shorten the exposure wavelength and, thus, reduce the minimum printable size, it has been proposed to use an extreme ultraviolet (EUV) radiation source. EUV radiation sources are typically configured to output a radiation wavelengths of around 5-20 nm, for example, 13.5 nm or about 13 nm or 6.5-6.8 nm. Thus, EUV radiation sources may constitute a significant step toward achieving small features printing. Such radiation is termed extreme ultraviolet or soft x-ray, and possible sources include, for example, laser-produced plasma sources, discharge plasma sources, or synchrotron radiation from electron storage rings. Because of the need for extreme accuracy, and because additionally of the need to work a vacuum environment with high reliability, designing actuators for EUV lithography apparatus is particularly demanding.

An example where arrays of actuators are required is in the facetted mirrors of an illumination system of an EUV optical apparatus. Numerous individual mirror facets may be provided in an array, each of which may need to be oriented in different directions to effect different illumination profiles at a target location. Actuators for field facet mirrors are described for example in the published international patent application WO 2011/000671 A1. The mechanisms described in that publication provide only two positions for each facet mirror, which are conveniently set by end stops. When seeking to extend the range of illumination profiles that can be achieved, actuators having more than two positions are desired, which may include movements in two or more degrees of freedom and may require intermediate positions that cannot be defined by end stops. Providing robust support for the field facet mirror in that case does not allow the mounting to have lower stiffness in one direction and higher stiffness in another. Therefore to provide a robust mounting implies an increase in the force required of the actuator motor. Whatever form the actuator takes, it should meet stringent requirements of size, cost and heat dissipation, as well as performance.

SUMMARY

It is desirable to have alternative actuators for moving parts relatively to one another. The inventors have sought to enable the design of actuators having increased degrees of freedom without the size and power dissipation drawbacks mentioned about. The actuator in one embodiment should be usable to move components such as field fact mirrors in an EUV optical system such as an EUV lithographic apparatus.

According to a first aspect of this invention, there is provided an actuation mechanism comprising a first part and at least one second part coupled to the first part via a resilient support so as to be movable with at least one degree of freedom relative to the first part, under the influence of an applied motive force, the resilient support being arranged to provide a biasing force increasing in response to relative displacement of the first and second parts and opposing said motive force, the mechanism further comprising a magnetic coupling between said first and second parts, the magnetic coupling being arranged to provide a counter-biasing force, the counter-biasing force partly opposing said biasing force thereby to reduce the motive force required to effect a given displacement.

The reduced motive force required enables a wider choice of motor arrangements, and may for example allow reduction in weight, size, cost and/or power dissipation.

In an embodiment, the resilient support permits relative movement between first and second parts with at least two degrees of freedom, for example tilting movement about first and second axes.

Said magnetic coupling may be provided for example provided by one or more permanent magnets mounted on one or both of said first and second parts.

Said magnetic coupling may be made adjustable to adjust a profile of said counter-biasing force against displacement.

The invention in a second aspect provides an optical apparatus comprising a series of optical components arranged to receive a radiation beam from a radiation source to process and deliver the beam to a target location, wherein said optical components include one or more movable optical components mounted on an actuator according to the first aspect of the invention as set forth above. The movable components may be provided for example as part of a fly's eye illuminator, and may be in an EUV illumination system operable with radiation with a wavelength in the range 5 to 20 nm.

The invention in another aspect provides a lithographic apparatus, comprising:

an illumination system configured to condition a radiation beam;

a support constructed to support a patterning device, the patterning device being capable of imparting the radiation beam with a pattern in its cross-section to form a patterned radiation beam;

a substrate table constructed to hold a substrate;

a projection system configured to project the patterned radiation beam onto a target portion of the substrate; and an optical apparatus according to the second aspect of the invention as set forth above, configured to condition at least one of the radiation beam in the illumination system and the patterned radiation beam in the projection system.

The invention in a further aspect provides a device manufacturing method comprising projecting a patterned beam of radiation onto a substrate, wherein the patterned beam is formed from a radiation beam which is conditioned by an optical apparatus according to the second aspect of the invention as set forth above, The invention yet further provides a device manufacturing method comprising projecting a patterned beam of radiation onto a substrate, wherein the patterned beam is formed from a radiation beam which is conditioned by an optical apparatus according to an embodiment of the invention as set forth above.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

The accompanying drawings, which are incorporated herein and form part of the specification, illustrate the present invention and, together with the description, further serve to explain the principles of the invention and to enable a person skilled in the relevant art(s) to make and use the invention. Embodiments of the invention are described, by way of example only, with reference to the accompanying drawings, in which:

FIG. 5 illustrates schematically the form of an actuation mechanism (a) without and (b) with a magnetic counter-biasing arrangement according to an embodiment of the invention;

FIG. 6 is a graph of certain forces in the actuation mechanism of FIG. 5, as a function of displacement;

Figure 1:
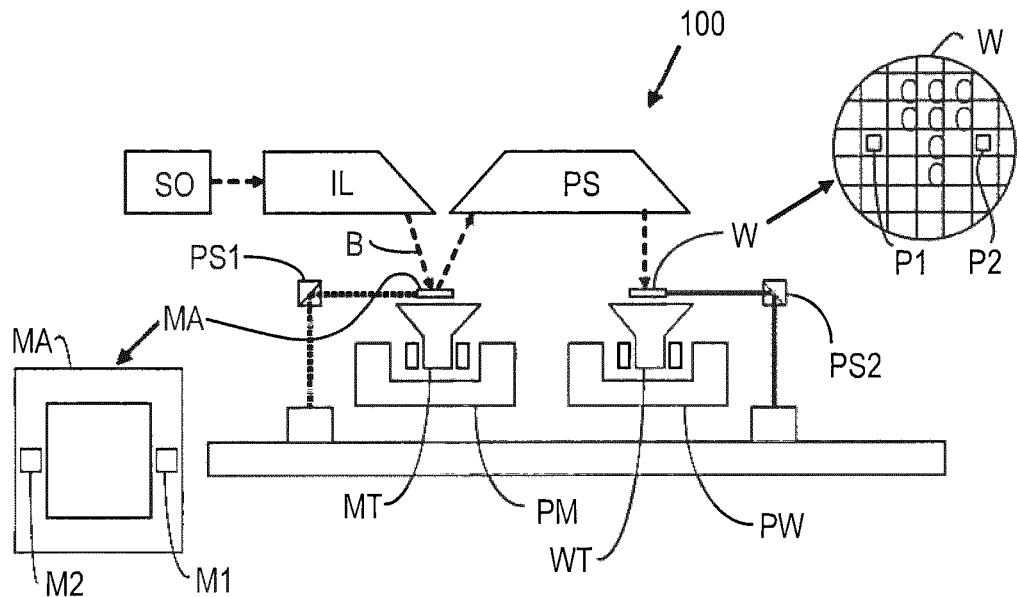
FIG. 1 depicts schematically a lithographic apparatus having reflective projection optics.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION OF EXEMPLARY EMBODIMENTS

This specification discloses one or more embodiments that incorporate the features of this invention. The disclosed embodiment(s) merely exemplify the present invention. The scope of the present invention is not limited to the disclosed embodiment(s). The present invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

The present invention concerns an actuation mechanism that may be deployed in a wide range of applications. In an example application, actuation mechanisms may be provided to move various components within a lithographic apparatus. The components may be optical components, and may for example be EUV optical components. Actuators deployed within such apparatus may have to meet stringent environmental and performance criteria. For example, it may be desirable to avoid friction between parts to avoid the need for lubricants and/or to avoid generating wear particles. An EUV apparatus typically includes a near-vacuum environment, so that outgassing materials such as lubricants cannot be tolerated. Low heat dissipation may also be a consideration. There will be described below a novel type of actuation mechanism that can help meet these stringent criteria. Before describing the actuator, some examples of EUV lithographic apparatus will be introduced. Further below we describe how the actuator may be deployed in one example application. It will be understood, however, that the invention of the actuator is widely applicable and not at all limited to use in lithographic apparatus in general, or EUV lithographic apparatus in particular.

FIG. 1 schematically depicts a lithographic apparatus 100 including a source collector module SO according to one embodiment of the invention. The apparatus comprises:

- an illumination system (illuminator) IL configured to condition a radiation beam B (e.g., EUV radiation).
- a support structure (e.g., a mask table) MT constructed to support a patterning device (e.g., a mask or a reticle) MA and connected to a first positioner PM configured to accurately position the patterning device;
- a substrate table (e.g., a wafer table) WT constructed to hold a substrate (e.g., a resist-coated wafer) W and connected to a second positioner PW configured to accurately position the substrate; and
- a projection system (e.g., a reflective projection system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g., employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source collector module SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector module SO may be part of an EUV radiation system including a laser, not shown in FIG. 1, for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g., mask) MA, the radiation beam B passes through the projection system PS, which focuses the beam onto a target portion C of the substrate W. With the aid of the second positioner PW and position sensor PS2 (e.g., an interferometric device, linear encoder or capacitive sensor), the substrate table WT can be moved accurately, e.g., so as to position different target portions C in the path of the radiation beam B. Similarly, the first positioner PM and another position sensor PS1 can be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

The depicted apparatus could be used in at least one of the following modes:

1. In step mode, the support structure (e.g., mask table) MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed.
2. In scan mode, the support structure (e.g., mask table) MT and the substrate table WT are scanned synchronously while a pattern imparted to the radiation beam is projected onto a target portion C (i.e., a single dynamic exposure). The velocity and direction of the substrate table WT relative to the support structure (e.g., mask table) MT may be determined by the (de-)magnification and image reversal characteristics of the projection system PS.

3. In another mode, the support structure (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
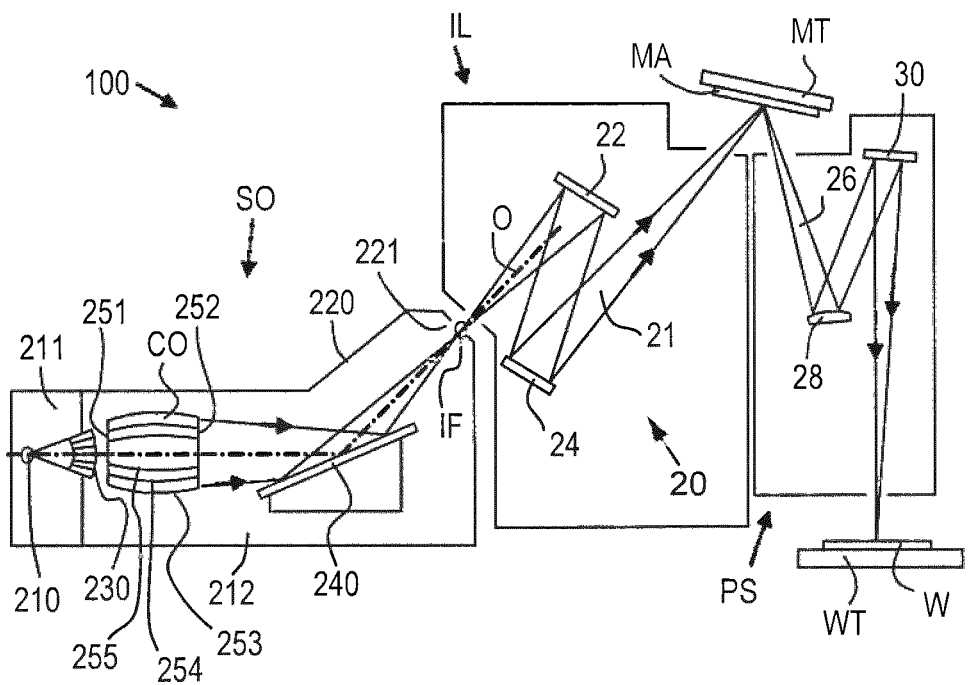
FIG. 2 is a more detailed view of the apparatus of FIG. 1.

FIG. 2 shows the apparatus 100 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap), which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 212 may include a radiation collector CO which may be a so-called grazing incidence collector. Radiation collector CO has an upstream radiation collector side 251 and a downstream radiation collector side 252. Radiation that traverses collector CO can be reflected off a grating spectral purity filter 240 to be focused in a virtual source point IF. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the Figures, for example there may be 1-6 additional reflective elements present in the projection system PS than shown in FIG. 2.

Collector optic CO, as illustrated in FIG. 2, is depicted as a nested collector with grazing incidence reflectors 253, 254 and 255, just as an example of a collector (or collector mirror). The grazing incidence reflectors 253, 254 and 255 are disposed axially symmetric around an optical axis O and a collector optic CO of this type is preferably used in combination with a discharge produced plasma source, often called a DPP source.

Figure 3:
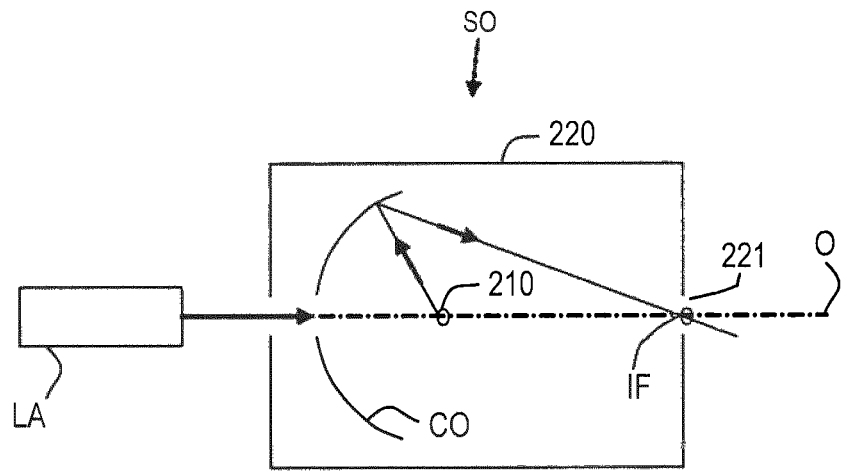
FIG. 3 is a more detailed view of an alternative source collector module SO for the apparatus of FIGS. 1 and 2.

Alternatively, the source collector module SO may be part of an LPP radiation system as shown in FIG. 3. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

Figure 4:
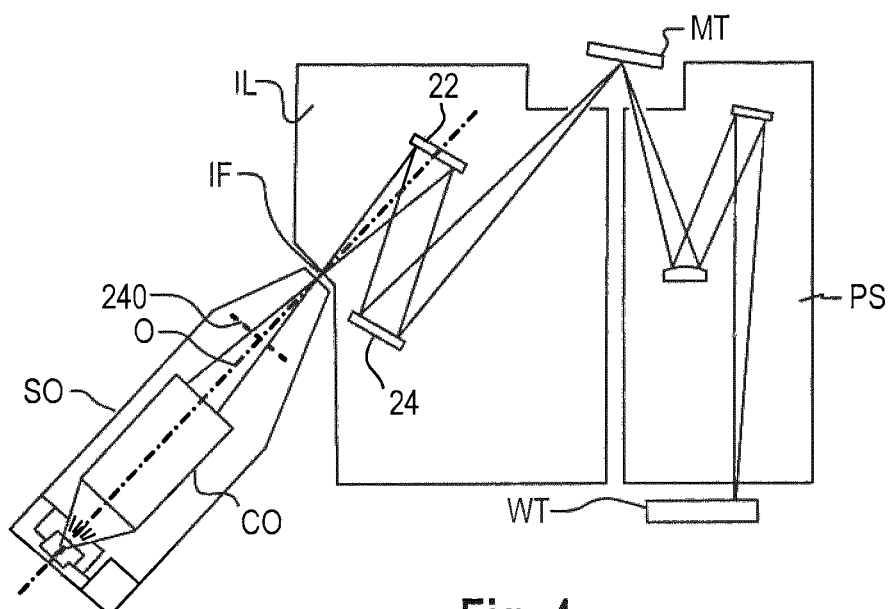
FIG. 4 depicts an alternative example of an EUV lithographic apparatus.

FIG. 4 shows an alternative arrangement for an EUV lithographic apparatus in which the spectral purity filter 240 is of a transmissive type, rather than a reflective grating. The radiation from source collector module SO in this case follows a straight path from the collector optic to the intermediate focus IF (virtual source point). Note that positioning the filter close to or at the IF will lead to very high absorbed power densities. The high temperatures that result may degrade the filter. On the other hand, the filter area can be small, which is an advantage. In alternative embodiments, not shown, the spectral purity filter 240 may be positioned at the virtual source point IF or at any point between the collector optic CO and the virtual source point IF. The filter can be placed at other locations in the radiation path, for example downstream of the virtual source point IF. Multiple filters can be deployed. As in the previous examples, the collector optic CO may be of the grazing incidence type (FIG. 2) or of the direct reflector type (FIG. 3). The spectral purity filter may be designed to suppress unwanted radiation in the infrared wave band, leaving DUV radiation to be suppressed by other means.

Novel Actuation Mechanism

FIG. 5 illustrates the principles of a novel actuation mechanism shown at (b), compared with a conventional mechanism (a). In each mechanism, an object O is mounted with one or more degrees of freedom for motion relative to a chassis C. A motor M applies force F to effect a desired movement. The object is restrained in each degree of freedom by a resilient mounting, represented by spring R in the schematic diagram. In the example shown, the object is free to move in a single degree of freedom only, parallel to an X axis as shown. In the absence of any applied force, the object rests at distance x from the chassis. When a force F is applied by the motor, the object moves by an amount dx, where the force F is balanced by the force of the spring R.

In the conventional mechanism (a), two competing design goals have to be reconciled. Firstly, for a robust mounting that will survive many operations without failure, the resilient mounting represented by spring R in the diagram should be relatively strong (stiff). Unfortunately, this implies that motor M must apply a relatively large force, to achieve a desired displacement dx. Providing a strong motor implies increased dimensions of the motor and increased power (heat) dissipation. Components of the actuator must also be made stronger in order to transmit the required forces without distortion or risk of failure. To achieve a compact, lightweight and low energy mechanism becomes very difficult.

In the novel actuation mechanism 100 of FIG. 5(*b*) an additional magnetic coupling is made between the object O and chassis C. A permanent magnet 102 is fixed to the object O, while a coupling part 104, which may be a simple piece of ferromagnetic metal, is fixed on the chassis. These elements 102 and 104 are coupled by magnetic lines of force 106, and are arranged such that the coupling becomes stronger, with increasing displacement dx.

Referring now to the graph shown in FIG. 6, the vertical axis represents force, while the horizontal axis represents the displacement dx of the object being actuated. Line 110 represents the force required to achieve a displacement dx against the resilience of the mounting, represented by spring R. This is shown as a simple linear relationship for the sake of illustration only. The mounting may be designed to provide a linear relationship between force and displacement, or may have some more complex relationship. Curve 112 represents a counterforce caused by the increasing magnetic coupling between magnet 102 and part 104, as dx increases and the spacing between the magnet and the coupling part decreases. The combined effect of the forces illustrated by curves 110 and 112 is a net force-displacement characteristic illustrated in the solid line 114 on the graph. As can be seen, thanks to the contribution from the magnetic coupling, a force F' required to achieve a displacement dx in the new mechanism is much less than a force F required to achieve the same displacement in the conventional mechanism.

As we will see from a practical example described below, the magnetic coupling components 102 and 104 can be designed with various configurations, so as to achieve a tailored response curve 112. As the magnetic force increases rapidly with proximity between the elements, they may be shaped and/or constrained so as to limit how closely the can approach. In the detailed embodiment described further below, it will be seen how desired characteristics can be achieved by design, and further how the magnetic coupling can be made adjustable in strength, so as to tune the force-displacement curve 114. The counterforce may be such that the characteristic achieve a negative gradient, corresponding to a "negative stiffness" regime being experienced by the motor. Examples of such characteristics are shown at 114' and 114". In such a regime, the motive force F' required to maintain a position dx becomes less than the force required to get to that position. This may be useful to save energy and heat dissipation when a position is to be maintained over a long time. On the other hand, care should be taken that the maximum magnetic counterforce should be less than the returning force of the spring R, or the object may become stuck at the new position. This may be a danger with the more extreme characteristic of curve 114". As the strength of a permanent magnet may vary with temperature, for example, a sufficient margin should be allowed to allow for all operating conditions.

Example Actuator Application—EUV Optical Apparatus

The following description presents optical apparatus and methods that can condition a radiation beam being directed at a target location on an object. The object can be, for example, a lithographic patterning device MA for generating a circuit pattern to be formed on an individual layer in an integrated circuit, or a substrate W on a substrate table WT of a lithographic apparatus. The target location may be an area of the patterning device MA illuminated by the illumination system IL. Example patterning devices include a mask, a reticle, or a dynamic patterning device. The reticles can also be for use within any lithography process, while the emphasis in this application will be on EUV lithography. Within the illumination system, actuators are used to move reflective elements so as to select different illumination modes.

Figure 7:
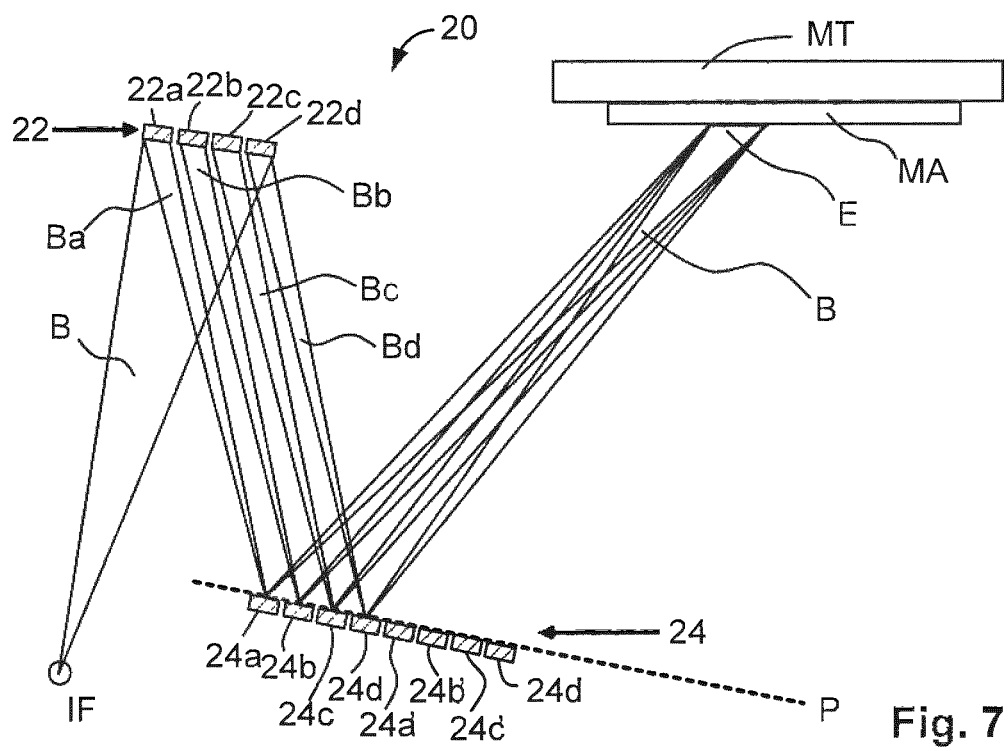
FIG. 7 is a first cross sectional view of part of an illumination system of a lithographic apparatus in which an actuation mechanism embodying the an embodiment of the invention may be used.

FIG. 7 schematically shows a cross sectional view of an exemplary optical apparatus 20 for conditioning a radiation beam in the illumination system IL of a lithographic apparatus of the type shown in FIGS. 1 to 4. Apparatus 20 includes a first reflective component 22 in the form of facetted field mirror device 22 and a second reflective component 24 in the form of facetted pupil mirror device 24. Facetted field mirror device 22 comprises a plurality of primary reflective elements, some particular ones schematically indicated in FIG. 7 and referred to as field facet mirrors 22*a*, 22*b*, 22*c* and 22*d*. The second reflective component 24 comprises a plurality of secondary reflective elements including, for example, the particular secondary reflective elements referred to as pupil facet mirrors 24*a*, 24*b*, 24*c*, 24*d*, and 24*a'*, 24*b'*, 24*c'*, 24*d'*.

Generally, the field facet mirrors 22*a-d* direct respective parts of incoming radiation beam B towards the pupil facet mirrors 24*a-d*, 24*a'-d'*. Although only four field facet mirrors 22*a-d* are shown, any number of field facet mirrors may be provided. The field facet mirrors may be arranged in a generally two-dimensional array, which does not mean that they should lie strictly in a flat plane. Although only eight pupil facet mirrors 24*a-d*, 24*a'-d'* are shown, any number of pupil facet mirrors may be provided, the number being typically a multiple of the number of field facet mirrors. The pupil facet mirrors may be arranged in a two-dimensional array. The shapes and configurations of the field facet mirrors and pupil facet mirrors may be square, rectangular, circular, or more complicated in shape, according to design.

Each field facet mirror 22*a-d* reflects a portion of the radiation beam B received by the first reflective component (22) in the form of a sub-beam of radiation towards a different pupil facet mirror 24*a-d* of the pupil mirror device 24. For example, a first sub-beam Ba is directed by a first field facet mirror 22*a* to a first pupil facet mirror 24*a*. Second, third and fourth sub-beams Bb, Bc and Bd are directed by second, third and fourth field facet mirrors 22*b*, 22*c*, and 22*d* respectively to second, third and fourth pupil facet mirrors 24*b*, 24*c*, and 24*d*. The spatial intensity distribution of the radiation beam B at the pupil mirror device 24 can define an illumination mode of the lithographic apparatus. In one embodiment, the field facet mirrors 22*a-d* have adjustable orientations, and they may be used with different ones of the pupil facet mirrors 24*a-d*, 24*a'-d'*, to form different spatial intensity distributions at the pupil plane P, thereby providing different illumination modes. This option, which is known per se, will be described later with reference to FIG. 8. The pupil facet mirrors 24*a-d* may also be adjustable in orientation.

Each of the field facet mirrors 22*a-d* is shaped so as to form an image of the intermediate focus IF at a different pupil facet mirror 24a-d, of the pupil mirror device 24. In practice, the intermediate focus IF will be a virtual image of the plasma source, the image having a finite diameter (e.g., 4-6 mm) Consequently, each field facet mirror 22a-d will form an image of the virtual source point IF which has a finite diameter (e.g., 3-5 mm) at the pupil facet mirrors 24a-d. The pupil facet mirrors 24a-d, may each have a diameter which is larger than the aforementioned image diameter (to avoid radiation falling between pupil facet mirrors and thereby being lost). The intermediate focus IF and images of the intermediate focus IF are shown as points in the figures for ease of illustration only.

The facetted mirror devices 22 and 24 together form a so-called "fly's eye" illuminator, by which non-uniformities present in the radiation source are eliminated to illuminate area E with more even distribution, and with more control. Each one of the pupil facet mirrors 24a-d may form an image of its associated field facet mirror 22a-d at or near the field plane wherein the patterning device MA is located during exposure of a substrate. These images are substantially overlapping and together form an illumination area E. As a result, a spatially non-uniform intensity distribution in a cross section of the radiation B as emanating from the source SO and received by the apparatus 20 is conditioned to have a substantially spatially uniform intensity distribution in the illumination area E. The shape of the illumination area E is determined by the shape of the field facet mirrors 22a-d. In a scanning lithographic apparatus the illumination area E may for example be a rectangle or a curved band, when viewed in two dimensions which in the scanning direction has a width narrower than the width in a direction perpendicular to the scanning direction.

A wavelength of the desired part of radiation may be an EUV wavelength in the range 5-20 nm, for example 13.5 nm. The beam B may also include large amounts of unwanted radiation, for example at DUV wavelengths. Other patent publications disclose techniques for reducing the transmission of unwanted radiation through the illuminator.

Figure 8:
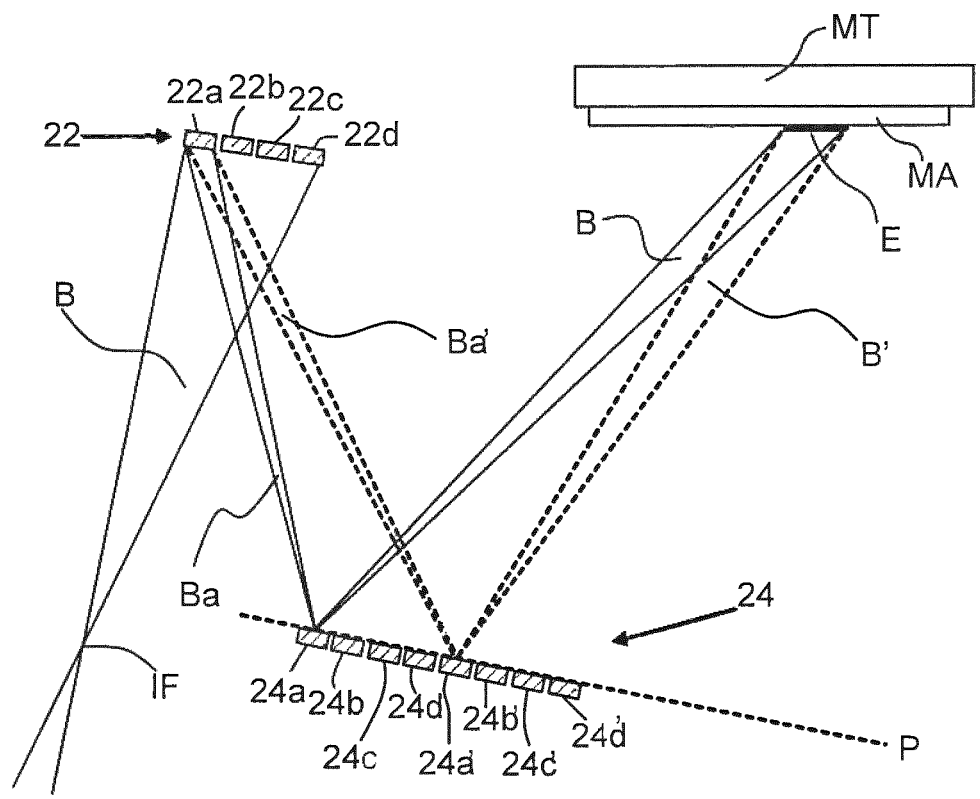
FIG. 8 is a second cross sectional view of the apparatus of FIG. 5 showing adjustment of a field facet mirror to address two associated pupil facet mirrors.

As mentioned already, each field facet mirror 22a-d of field mirror device 22 may have more than one associated pupil facet mirrors of pupil mirror device 24. A field facet mirror of field mirror device 22 can be controlled to cooperate with different ones of its associated pupil facet mirrors at different times. For example, as shown in FIG. 8, field facet mirror 22a has two associated pupil facet mirrors 24a and 24a'. These are used in different illumination modes of illuminator 20. Field facet mirror 22a may thus be controlled in a second mode to direction EUV radiation towards pupil facet mirror 24a' instead of 24a, while radiation with an undesired wavelength, such as DUV radiation may be scattered to fall onto neighboring pupil facet mirrors like 24c, 24d, 24b' or 24c'. In some embodiments, pupil facet mirrors may also have controllable orientation. Again, the design can be made such that the pupil facet mirrors most closely surrounding the associated mirror will direct the scattered DUV radiation away from the target (illumination area E).

Figure 9:
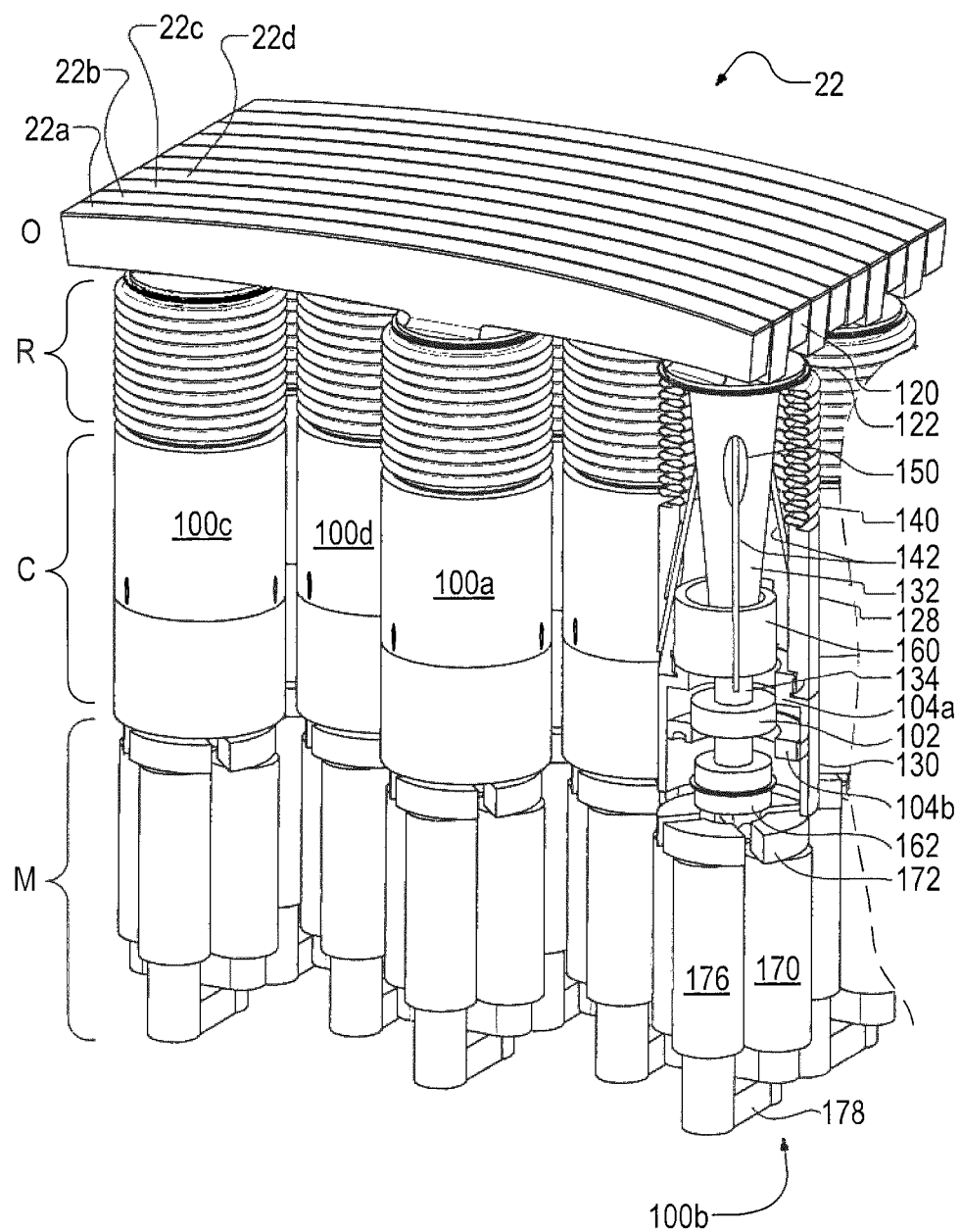
FIG. 9 is an external and partially cut away view of a field facet mirror module in a lithographic apparatus embodying the invention.
Figure 10:
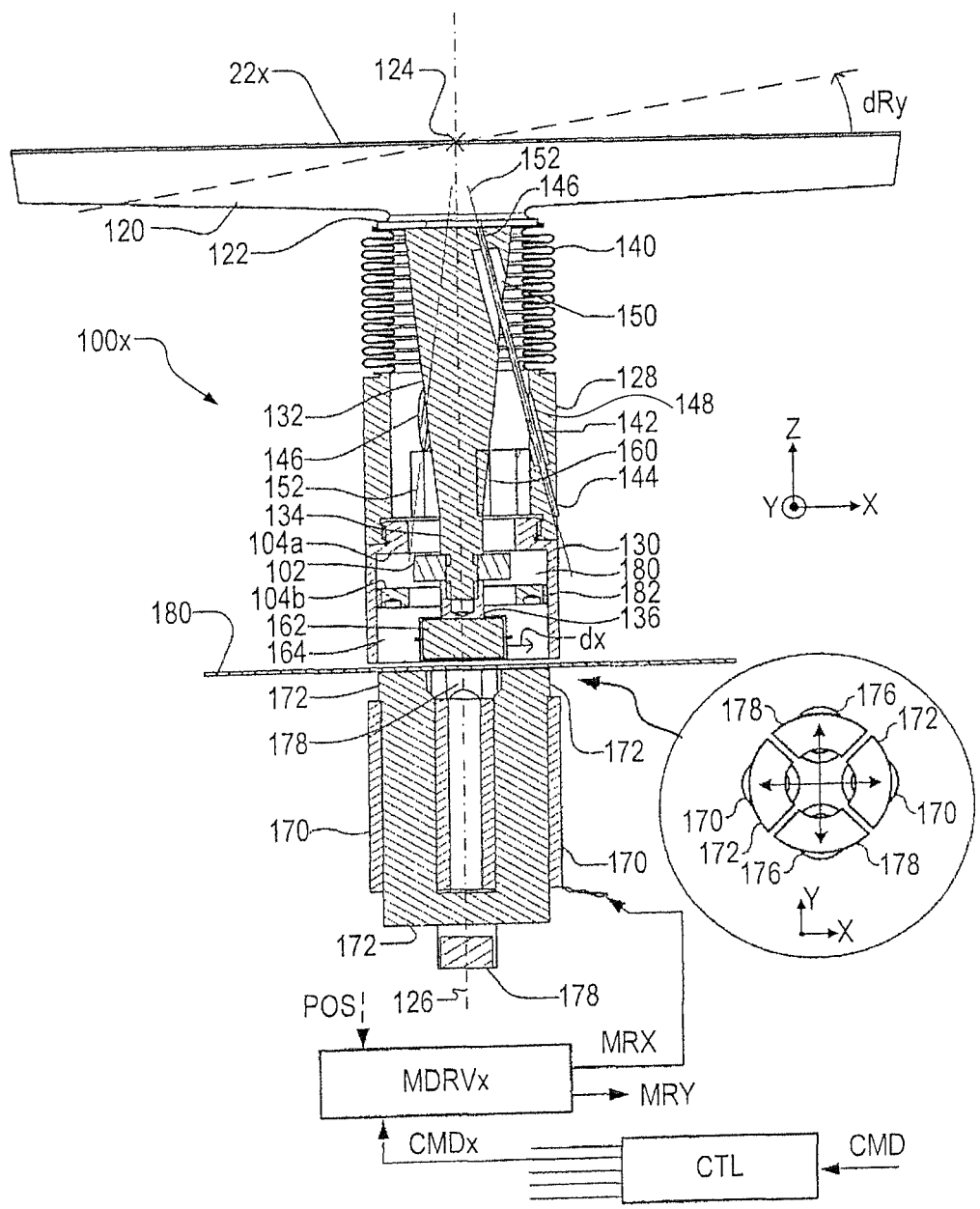
FIG. 10 is a cross sectional view of one actuation mechanism in the mirror module of FIG. 9.

FIGS. 9 and 10 illustrate a practical embodiment in which several actuators of the general type shown in FIG. 5(b) are applied to effect movement of reflecting elements serving as field facet mirrors 22a to 22d etc in the illumination system of an EUV lithography apparatus such as the ones described above. In FIG. 9, we have a perspective view of a faceted field mirror sub-assembly having ten moveable elements 22a etc, each mounted on an individual actuator 100a etc. The actuator 100b connected to element 22b is shown cut away, with individual parts labeled. FIG. 10, we see a generic element 22x mounted on the head of an actuator 100x. The same reference signs are used for the parts of the actuator and the reflective element in both FIGS. 9 and 10, and both can be referred to when reading the following description. For ease of interpretation, the reflective surfaces are shown facing upward in the diagram. As is seen in FIGS. 1 to 4 and 7 and 8, in known lithography apparatus, the faceted field mirror 22 and its reflective elements in fact face generally downwards towards the ground. References to up and down directions, and terms such as "above" and "below" in the description of FIGS. 9 and 10 refer to the orientation as seen in the drawings, and do not imply any particular orientation when the apparatus is installed in its operating environment.

In relation to the schematic drawing of FIG. 5, at the left hand side in FIG. 9 portions of the sub-assembly are broadly identified as corresponding to the motor M, chassis C, resilient mounting (spring) R and the actuated object itself, O. While particular forms of these elements are illustrated in this example, each of them may be substituted for different forms, without departing from the principle of the invention. Some example variations will be described below, while the number of variations available is practically infinite.

In the example illustrated, the object to be moved comprises a body 120 on which the reflective element 22x is formed. As can be seen, each reflective element comprises an elongated, curved, near-planar surface. The actuator 100x has a head 122 on which body 120 is mounted. In this example, the body and actuator provide two rotational degrees of freedom centered on a virtual pivot point 124. A first degree of freedom is rotation about a Y axis pointing into the page in FIG. 10. Displacement in this degree of freedom is indicated by the tilt angle dRy. It will be understood that the tilt angle here is shown highly exaggerated. The second degree of freedom is rotation about an X axis, also through the virtual pivot point 124, the X axis running across the page in FIG. 10.

Actuator 100x, is generally cylindrical in form, allowing it to cluster side by side with similar actuators for the other reflecting elements in the subassembly. An axis 126, vertical in the diagrams, extends in the Z direction. A chassis part of the actuator is formed by cylindrical casing formed in upper and lower sections 128 and 130. Actuator head 122 is fixed to an actuating rod, here shown with an upper portion 132 which tapers in a downward direction to intermediate portion 134 and lower portion 136. In the example, portions 132 and 134 are machined from a single piece of metal, while portion 136 is attached to portion 134 by a screw thread. Such details are of course a matter of design choice. The actuator head and rod are supported on upper casing 128 by a combination of bellows section 140 and three tendons, all labeled 142. Each tendon 142 is fixed at a first end 144 into the wall of casing section 128 and at a second end into actuator rod 132, just below the head 122. Tendons 142 which also pass through apertures 148 and 150 formed in those parts, as shown. For compatibility with the vacuum environment within EUV lithography apparatus, bellows section 140 may for example be made of corrugated metal.

It will be appreciated that the wall thickness and corrugation of the bellows section is thin enough to permit the two dimensional tilting motions dRx and dRy that are desired to adjust the angle of mirror 22x. With regard to other degrees of freedom, tendons 142 effectively form a tripod which constrains the head against translation of desired virtual pivot point 124 in X, Y, and Z directions, while bellows 140 constrains rotation Rz. "Constraining" in this context means providing a very high degree of stiffness against the relevant degree of freedom, sufficient to act effectively as a rigid mounting. Unfortunately, both the tripod and bellows also have non-zero stiffness in the non-constrained degrees of freedom Rx and Ry. It is this parasitic stiffness that is represented by the spring R in FIG. 5, and that has to be overcome by the motive force to achieve the desired operations of the actuator 100x.

Within upper casing section 128 and surrounding the actuator rod, a flexible link 160 provides a thermal connection between actuator rod part 132 (and via this the mirror body 120) to the casing. Casing section 128 may be mounted in a water cooled base plate, not shown in the drawings. The thermal link may be for example a so-called Litz wire, comprising a bundle of fine copper wires. Instead of Litz wire, alternative flexible thermal links might be used, like flexible heat pipes. The thermal link introduces further parasitic stiffness, though it may be small in comparison with that of the mounting.

At the lower end of the actuator rod, rod portion 136 carries a permanent magnet 162, which forms a moving part of a motor function. Bottom section 130 of the casing provides a chamber 164 in which magnet 162 is free to move in both the x and y directions. Thanks to the constraints defining the virtual pivot point 124, displacement dx of magnet 162 translates into the desired tilting motion dRy. Similarly a displacement dy into the page (FIG. 10) is sufficient to effect a tilt dRx about the X axis about the same pivot point 124. To effect this movement in a controllable manner, and specifically to provide actuating forces against the centering force imparted by bellows section 140 and tripod tendons 142, a static portion of the actuator comprises a bipolar electromagnet formed by coils 170 on ferromagnetic core 172. Coils 170 and core 172 are formed in a U shape, and can be energized to provide actuating forces in both positive and negative directions along the X axis to achieve displacement dx and hence rotation (tilt) dRy. The coils though shown as a pair can be energized in unison by connecting them in series. Independent driving of the coils, an different arrangements of coils, are of course possible.

A top view of the core 172 and coils 170 is provided in an inset detail in FIG. 10. As can be seen, a second bipolar electromagnet is formed by a second pair of coils 176 is arranged orthogonally to the coils 170, on a U-shaped core 178. Energizing these coils can be used to impart a displacement dy to the magnet 162, and hence effect a tilt dRx of field facet mirror 22x about the X axis. Drive circuitry MDRVx is provided to generate drive signals MRX, MRY for the coils to achieve desired positioning of magnet 162, in response to command signals CMDx received from a controller CTL. Controller CTL, for example may generate command signals for all similar drive circuits in all the actuators of the faceted field mirror or the sub-assembly. Controller CTL can be programmed for example to receive a higher level command CMD, which may indicate a particular desired illumination mode, and to infer the individual positions required for each field facet mirror. In the example illustrated, a magnetic coupling is used between the actuator rod magnet 162 and the energizing part of the motor formed by coils 170, 176, to allow environmental isolation between different parts of the mechanism. A non-ferromagnetic membrane 180, which may for example be of thin stainless steel, provides this isolation in the illustrated embodiment. The drive circuitry and electromagnets can thus be placed outside the vacuum environment, or in a sub-environment, distinct from the sensitive environment within the illumination system of an apparatus such as an EUV optical apparatus. This environmental isolation may relax design constraints and choice of materials on the motor components. It may improve access for maintenance. As the coils 170 when energized constitute a source of heat, the choice of magnetic coupling to the actuator rod also allows a degree of thermal isolation.

In alternative embodiments, the principle of magnetic actuation can be applied without the use of electromagnets. For example, a permanent magnet, set up to attract (or repel) the magnet 162, can be mounted on a mechanical drive mechanism, coupled to conventional motors with suitable gearing. The electromagnetic arrangement illustrated here has the advantage of no moving parts. In yet other embodiments, the motive force F in one of more directions may be applied to the actuator rod or equivalent body by other means. In the prior patent mentioned in the introduction, for example, bimetallic strips are used to apply actuating forces directly to an actuator rod. Another example might be piezoelectric motors. The preferred type of motor mechanism will also vary, in optical applications and in other applications generally requiring different degrees of freedom.

In the prior examples related to actuators for field facet mirrors in EUV optical systems, it has generally been sufficient to provide two operating positions, for example to effect the two illumination modes illustrated in FIG. 8. To provide a greater number of illumination modes, without sacrificing unduly the available radiation, actuators with more than two positions are desired. Referring to the illustrated example having two rotational degrees of freedom, in a case where each coil is either wholly energized or wholly de-energized, the number of positions (orientations) of each field facet mirror 22x may be four, or five if the central rest position is also included. In a case where the motor drive circuitry MDRVx is capable of varying the energizing currents of the different coils, and capable of causing displacement in both the X and Y directions simultaneously, a far greater number of positions are possible.

Since it may be impractical to control so many positions with end stops, and since the displacement may not be accurately enough correlated with the drive current of the coils under all operating conditions, a feedback control loop may be implemented, using a position signal POS, illustrated by the dotted input in FIG. 10. This position signal may be obtained for example by an optical sensor, not shown in the diagram, which reflects one or more beams of light from reflective surfaces within the actuator or on the facet body of 120 itself. Optical position sensing techniques are well known to those skilled in the art, and need not be described further.

As explained above, the detailed implementation of actuators of the type illustrated here requires a compromise between robustness of the mounting, reflected in stiffness of the bellows section 140 and tripod (tendons 142), and the actuation force available through the motor (here the coils and magnet 162). In the prior patent application, two-position actuators are provided with a relatively low stiffness in the movement direction, and a higher stiffness in an orthogonal direction. This resolves the compromise satisfactorily. In the case of the present the two-axis, multi-position actuator, however, the resilient mounting is required to have more or less equal stiffness in both directions. Consequently, the compromise between robustness of the support and ease of displacement becomes much harder to achieve.

In order to reduce the motive force required, and hence to avoid problems of increased size and heat dissipation in the electromagnets or other motor function, the principle described above in relation to FIG. 5(b) is applied in the present example, as will now be explained. Recalling the description of FIG. 5, a magnetic coupling is established between a magnet 102 mounted at the interface between actuator rod sections 132 and 136, and fixed elements 104a and 104b. Elements 104a, 104b are positioned above and below a cavity 180 in which magnet 102 can move with the rod. These parts and the cavity they form are circularly symmetric with respect to the axis 126, so that magnet 102 is in the form of a ring, for example with north pole uppermost and south pole lowermost. Elements 104a and 104b form upper and lower rings, defining the annular cavity 180.

With progressive displacement dx and/or dy, a greater portion of the magnet 102 will enter the space between the rings 104a and 104b. Its magnetic field lines will increasingly be coupled into the material of the rings 104a and 104b, via casing section 130. This provides an attractive force biasing the magnet 162 radially away from the axis 126, and hence biasing the rod and mirror 22x preferentially into tilted orientations. This magnetic counter-bias partially counteracts the centering forces provided by bellows section 140. By selection of suitable magnet 102 and by dimensioning the ring portions and cavity 180 appropriately, the relationship between the de-centering bias provided by metal by magnetic coupling (curve 112 in FIG. 6) and the centering bias caused by the bellows section 140 and tripod (tendons 142) (curve 110) a desired relationship (e.g. curve 114) between displacements dx, dy and the energizing strength of the electromagnet coils 170 can be achieved. Without compromising the robustness of the resilient mounting, the actuating force required to achieve desired positions of the facet mirror 22x can be reduced. In the embodiment illustrated, the lower magnetic coupling ring 104b can be adjusted up and down (z direction) inside casing section 130 by means of screw thread 182. This allows fine adjustment of the magnetic bias characteristic (112).

Figure 11A:
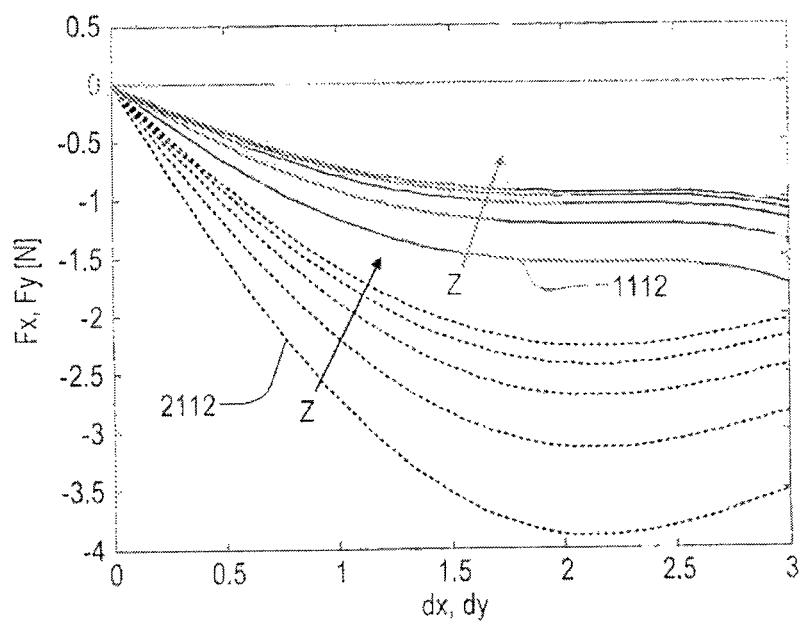
FIG. 11 shows graphs of (a) force and (b) stiffness against displacement, being the characteristics of a counter-biasing arrangement in various embodiments of the invention.
Figure 11B:
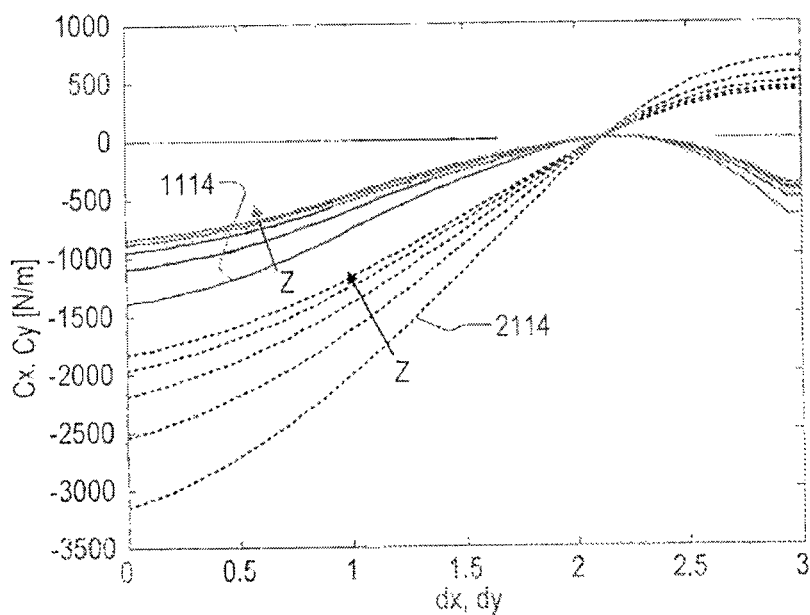

FIGS. 11(a) and (b) are graphs showing calculated characteristics of the magnetic counter-biasing arrangement in different embodiments of the actuator 110x. FIG. 11(a) shows graphs of resistance force against displacement dx (or dy) in one radial direction, from dx=0 (actuator centered) to dx=3 mm (maximum tilt). FIG. 11 (b) shows corresponding graphs of stiffness Cx (or Cy), which is simply the derivative of the force with respect to displacement. The arrangement is rotationally symmetric, and therefore so is the characteristic. As the counter-bias arrangement is designed to attract the moving magnet 102 away from the central position, the graphs show negative force values, just as in the case of the characteristic 112 in FIG. 6. Similarly, as shown in the lower graph (b), this results in an effect of "negative stiffness," when set against the stiffness of the mounting itself. The arrangement is modeled as a ring magnet 102 between two rings representing the fixed elements 104a and 104b. One of the elements can be adjusted in the z direction to increase the gap between the elements (increasing z) or reduce the gap (reducing z). The casing inner diameter may be for example 16 mm and the outer diameter of magnet 102 may be for example 10 mm, allowing a range of movement dx, dy=+/−3 mm.

Referring firstly to the solid lines 1112 and 1114 in FIGS. 11(a) and (b), these show the characteristics of a first embodiment in which the fixed elements of the magnetic coupling are simply ferromagnetic material (steel or iron), as depicted in FIGS. 9 and 10. Depending on the position z of the adjustable element 104b, the attractive force between the moving magnet and fixed elements can be increased or decreased, for a given displacement, as illustrated by the series of solid curves. The range of adjustments in the model is in 0.5 mm steps over a total range of 2 mm, with an arrow representing the direction of increasing z. It can be seen immediately that a useful tuning of the counter-biasing force can be achieved by turning the element 104b in its thread 182.

Referring now to the dotted lines 2112 and 2114 in FIGS. 11(a) and (b), these show the characteristics of a second embodiment, in which the rings representing elements 104a and 104b defining the cavity 180 are magnetized, as well as the moving magnet 102. As one would expect, provided the poles of these magnets are appropriately oriented, the attractive force represented by line 2112 can be much greater than that at 1112. Similarly, the negative stiffness represented by line 2114 can be two or more times greater than that at 1114. Moreover, the range of adjustment in these characteristics that can be obtained by adjusting the position of element 104b is greater than with the simple ferromagnetic elements. Using such a counter-biasing arrangement, suitably adjusted, a mounting that requires a force of, say, 4 N to obtain a desired displacement can be driven by a motive force of 1 N or less.

Numerous variations and modifications are possible without departing from the spirit and scope of the invention. Some of these have been mentioned already above. Others will be mentioned here, without intending to provide an exhaustive list. While the magnetic coupling in the illustrated examples is a de-centering bias, to counter a centering bias inherent in the resilient mounting of the object to be actuated, other applications and other embodiments they involve a resilient mounting biased only one direction, with a magnetic counter bias in the opposite direction.

The desire for the particular combination of degrees of freedom and degrees of constraint in actuator 100x is a function of the particular optical system in which is applied. Other embodiments of such optical systems, not to mention actuators and mountings for totally different applications, may suggest different freedoms and constraints. Even where the desired degrees of freedom and constraints are the same as illustrated here, numerous alternative mechanisms for providing a resilient mounting with the desired freedoms and constraints can be envisaged by the skilled reader. For example, alternative actuator designs disclosed in the patent application mentioned in the introduction rely on leaf springs formed by cutting out material from the casing of the actuator. Such a construction, as well as the bellows construction illustrated in the present application, has the merit of requiring no frictional contact between moving parts, reducing the risk of contaminant particles entering the operating environment.

While the actuator illustrated in these examples is designed to provide a tilt in two axes perpendicular to an axis of the actuator body, other forms of actuator may be designed to provide rotation about the axis. The motor functions in such embodiments may be implemented by conventional motors, voice coils or the like. The magnetic coupling to provide the counter bias will be provided so as to increase or decrease coupling with rotation angle (dRz), rather than a linear displacement dx or dy. While the counter-bias magnet 102 is shown as a permanent magnet mounted to the moving part (actuator rod 132/136 in this example) the counter-bias magnet may in other embodiments be mounted to the fixed chassis, and/or may be an electromagnet. Permanent magnets and/or electromagnets may be provided on both moving and fixed parts, to provide more elaborate or stronger bias curves 112.

In principle, the functions of motor magnet 162 and counter-bias magnet 102 could be combined in a single magnet or magnet system. In addition to electromagnetic motors and the bimetallic strip actuator mentioned above, other types of motor such as piezoelectric may be used. It will be appreciated that lower casing section 130 can act also as a shield to prevent interference between neighboring actuators and/or other components. Shielding could alternatively be provided by an arrangement of plates woven between the actuators (like an egg box). However, the inventors have found that cross-talk between neighboring actuators is greatly reduced by providing each with an individual shield of the type shown. There are thus effectively two shields between any pair of actuators. Moreover, the shield itself has a magnetic influence on the moving magnet 162, so that a symmetrical, cylindrical shape helps achieve a uniform performance across the 2-D range of movement. In this regard, the casing section 130 acts as part of the magnetic counter-biasing arrangement discussed above.

Similarly a shield (not shown) can be provided around the electromagnets formed by coils and cores 170-178. Further, thermal management measures can be deployed to remove excess heat from the electromagnets or other form of motor.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of EUV optical systems, it will be appreciated that the invention may be used in other applications, whether in optical systems, whether in lithography or completely different applications, and whether in vacuum or other environments.

The term "lens," where the context allows, may refer to any one or combination of various types of optical components, including refractive, reflective, magnetic, electromagnetic and electrostatic optical components.

The invention has been developed particularly for adjusting the position or orientation of optical components in EUV lithography. The invention is not limited to such application, nor to such particular wavelength ranges. While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims or clauses set out below.

CLAUSES

1. An actuation mechanism, comprising:
    a first part and at least one second part coupled to the first part via a resilient support so as to be movable with at least one degree of freedom relative to the first part, under the influence of an applied motive force, the resilient support being configured to provide a biasing force increasing in response to relative displacement of the first and second parts and opposing said motive force; and
    a magnetic coupling between said first and second parts, the magnetic coupling being configured to provide a counter-biasing force, the counter-biasing force partly opposing said biasing force thereby to reduce the motive force required to effect a given displacement.
2. The mechanism of clause 1, wherein said resilient support permits relative movement between first and second parts with at least two degrees of freedom.
3. The mechanism of clause 1, wherein said actuation mechanism has a longitudinal axis, and wherein said resilient support permits tilting movement about first and second axes orthogonal to said longitudinal axis.
4. The mechanism of clause 1, wherein said magnetic coupling is provided by one or more permanent magnets mounted on each of said first and second parts.
5. The mechanism of clause 4, wherein said magnetic coupling is provided by one or more permanent magnets mounted on one of said parts only.
6. The mechanism of clause 1, wherein said magnetic coupling is adjustable to adjust a profile of said counter-biasing force against displacement.
7. The mechanism of clause 1, further comprising a motor arrangement for applying said motive force between said first and second parts.
8. The mechanism of clause 7, wherein said motor arrangement comprises one or more electromagnets mounted on one or both of said first and second parts.
9. The mechanism of clause 8, wherein said motor arrangement comprises a permanent magnet mounted to one of said parts and one or more electromagnets mounted to the other of said parts, said motor arrangement applying said motive force when said electromagnet or electromagnets is or are energized with electric current.
10. An optical apparatus, comprising:
    a series of optical components arranged to receive a radiation beam from a radiation source, and to process and deliver the beam to a target location, wherein said optical components include one or more movable optical components mounted on an actuator, wherein each of the one or more movable optical components comprises:
        a first part and at least one second part coupled to the first part via a resilient support so as to be movable with at least one degree of freedom relative to the first part, under the influence of an applied motive force, the resilient support being configured to provide a biasing force increasing in response to relative displacement of the first and second parts and opposing said motive force; and
        a magnetic coupling between said first and second parts, the magnetic coupling being configured to provide a counter-biasing force, the counter-biasing force partly opposing said biasing force thereby to reduce the motive force required to effect a given displacement.
11. An optical apparatus of clause 10 wherein said movable optical components form part of an illumination system for conditioning said beam and delivering it to a target location on a patterning device, and wherein said movable component is movable to vary an incidence angle of the conditioned beam at the target location.
12. The apparatus of clause 11, wherein a plurality of said movable components are provided as part of a fly's eye illuminator.
13. The apparatus of clause 12 wherein, said optical components are reflective components and said illumination system is an EUV illumination system operable with radiation with a wavelength in the range 5 to 20 nm
14. A lithographic apparatus, comprising:
an illumination system configured to condition a radiation beam;
a support configured to support a patterning device, the patterning device being capable of imparting the radiation beam with a pattern in its cross-section to form a patterned radiation beam;
a substrate table configured to hold a substrate;
a projection system configured to project the patterned radiation beam onto a target portion of the substrate; and
an optical apparatus configured to condition at least one of the radiation beam in the illumination system and the patterned radiation beam in the projection system, wherein the optical apparatus comprises:
a first part and at least one second part coupled to the first part via a resilient support so as to be movable with at least one degree of freedom relative to the first part, under the influence of an applied motive force, the resilient support being configured to provide a biasing force increasing in response to relative displacement of the first and second parts and opposing said motive force; and
a magnetic coupling between said first and second parts, the magnetic coupling being configured to provide a counter-biasing force, the counter-biasing force partly opposing said biasing force thereby to reduce the motive force required to effect a given displacement.
15. A lithographic projection apparatus arranged to project a pattern from a patterning device onto a substrate, wherein the lithographic projection apparatus includes an optical apparatus configured to condition a radiation beam that is used illuminate the patterning device, wherein the optical apparatus comprises:
a first part and at least one second part coupled to the first part via a resilient support so as to be movable with at least one degree of freedom relative to the first part, under the influence of an applied motive force, the resilient support being configured to provide a biasing force increasing in response to relative displacement of the first and second parts and opposing said motive force; and
a magnetic coupling between said first and second parts, the magnetic coupling being configured to provide a counter-biasing force, the counter-biasing force partly opposing said biasing force thereby to reduce the motive force required to effect a given displacement.
16. A device manufacturing method comprising projecting a patterned beam of radiation onto a substrate, wherein the patterned beam is formed from a radiation beam that is conditioned by an optical apparatus comprising:
a first part and at least one second part coupled to the first part via a resilient support so as to be movable with at least one degree of freedom relative to the first part, under the influence of an applied motive force, the resilient support being configured to provide a biasing force increasing in response to relative displacement of the first and second parts and opposing said motive force; and
a magnetic coupling between said first and second parts, the magnetic coupling being configured to provide a counter-biasing force, the counter-biasing force partly opposing said biasing force thereby to reduce the motive force required to effect a given displacement.

What is claimed is:
1. An optical apparatus comprising:
a series of optical components arranged to receive a radiation beam from a radiation source and configured to process and deliver the beam to a target location,
wherein said optical components include one or more movable optical components mounted on an actuator mechanism,
wherein the actuator mechanism comprises:
a first part and at least one second part, coupled to the first part, via a resilient support so as to be movable with at least one degree of freedom relative to the first part under the influence of an applied motive force, the resilient support being arranged to provide a biasing force increasing in response to relative displacement of the first and second parts and opposing said motive force, and
a magnetic coupling between said first and second parts, the magnetic coupling being arranged to provide a counter-biasing force, the counter-biasing force partly opposing said biasing force to reduce the motive force required to effect a given displacement.
2. The optical apparatus as claimed in claim 1 wherein said resilient support permits relative movement between the first and second parts with at least two degrees of freedom.
3. The mechanism optical apparatus as claimed in claim 1 wherein said actuation mechanism has a longitudinal axis, and wherein said resilient support permits tilting movement about first and second axes orthogonal to said longitudinal axis.
4. The optical apparatus as claimed in claim 1 wherein said magnetic coupling is provided by one or more permanent magnets mounted on each of said first and second parts.
5. The optical apparatus as claimed in claim 1 wherein said magnetic coupling is provided by one or more permanent magnets mounted on one of said parts only.
6. The optical apparatus as claimed in claim 1 wherein said magnetic coupling is adjustable to adjust a profile of said counter-biasing force against displacement.
7. The optical apparatus as claimed in claim 1 further comprising a motor arrangement for applying said motive force between said first and second parts.
8. The optical apparatus as claimed in claim 7 wherein said motor arrangement comprises one or more electromagnets mounted on one or both of said first and second parts.
9. The optical apparatus as claimed in claim 8 wherein said motor arrangement comprises a permanent magnet mounted to one of said parts and one or more electromagnets mounted to the other of said parts, said motor arrangement applying said motive force when said electromagnet or electromagnets is or are energized with electric current.
10. The optical apparatus as claimed in claim 1 wherein said movable optical components form part of an illumination system for conditioning said beam and delivering it to a target location on a patterning device, and wherein said movable component is movable to vary an incidence angle of the conditioned beam at the target location.

11. The optical apparatus as claimed in claim 10 wherein said movable optical components are provided as part of a fly's eye illuminator.

12. The optical apparatus as claimed in claim 11 wherein said optical components are reflective components and said illumination system is an EUV illumination system operable with radiation with a wavelength in the range 5 to 20 nm.

13. A lithographic apparatus, comprising:
   an illumination system configured to condition a radiation beam;
   a support constructed to support a patterning device, the patterning device being capable of imparting the radiation beam with a pattern in its cross-section to form a patterned radiation beam;
   a substrate table constructed to hold a substrate;
   a projection system configured to project the patterned radiation beam onto a target portion of the substrate; and
   an optical apparatus according to claim 1 configured to condition at least one of the radiation beam in the illumination system and the patterned radiation beam in the projection system.

14. A lithographic projection apparatus arranged to project a pattern from a patterning device onto a substrate, wherein the lithographic projection apparatus includes an optical apparatus according to claim 1 to condition a radiation beam which is used to illuminate the patterning device.

15. A device manufacturing method comprising projecting a patterned beam of radiation onto a substrate, wherein the patterned beam is formed from a radiation beam which is conditioned by an optical apparatus according to claim 1.

* * * * *

UNITED STATES PATENT AND TRADEMARK OFFICE
CERTIFICATE OF CORRECTION

PATENT NO. : 9,494,878 B2
APPLICATION NO. : 14/435315
DATED : November 15, 2016
INVENTOR(S) : Buis et al.

It is certified that error appears in the above-identified patent and that said Letters Patent is hereby corrected as shown below:

In the Claims

In Claim 3, Column 20, Line 39, please delete "mechanism".

Signed and Sealed this
Tenth Day of April, 2018

Andrei Iancu
*Director of the United States Patent and Trademark Office*